United States Patent [19]

Tidemann et al.

[11] Patent Number: 5,526,935
[45] Date of Patent: Jun. 18, 1996

[54] COMPONENT CARRIER TAPE

[75] Inventors: Dale R. Tidemann; Thomas Skrtic, both of Eau Claire, Wis.; Scott L. Ciliske, St. Paul, Minn.

[73] Assignee: Minnesota Mining and Manufacturing Company, St. Paul, Minn.

[21] Appl. No.: 386,571

[22] Filed: Feb. 15, 1995

[51] Int. Cl.⁶ .............................. B65D 85/86; B65D 73/02
[52] U.S. Cl. .............................................. 206/713; 206/722
[58] Field of Search .................................. 206/701, 713, 206/714, 717, 722

[56] References Cited

U.S. PATENT DOCUMENTS

| | | |
|---|---|---|
| 3,465,874 | 9/1969 | Hugle et al. . |
| 3,535,413 | 10/1970 | Glenn, Jr. . |
| 3,647,465 | 3/1972 | Shamay . |
| 4,069,916 | 1/1978 | Fowler et al. . |
| 4,266,416 | 5/1981 | Festag et al. . |
| 4,736,841 | 4/1988 | Kaneko et al. ..................... 206/714 |
| 4,829,663 | 5/1989 | Masujima et al. . |
| 4,921,102 | 5/1990 | Van Erden ............................ 206/470 |
| 5,150,787 | 9/1992 | Bird et al. . |
| 5,191,693 | 3/1993 | Umetsu ................................. 29/429 |
| 5,199,564 | 4/1993 | Skrtic . |
| 5,291,993 | 3/1994 | Schenz et al. . |
| 5,325,654 | 7/1994 | Juntunen et al. . |
| 5,351,821 | 10/1994 | Skrtic . |
| 5,472,085 | 12/1995 | Gelzer ................................... 206/714 |

FOREIGN PATENT DOCUMENTS

| | | | |
|---|---|---|---|
| 9304519 | 7/1993 | Germany ..................... B65D 75/24 |
| 2-206140 | 8/1990 | Japan ............................ H01L 21/60 |

*Primary Examiner*—Jacob K. Ackun
*Attorney, Agent, or Firm*—Gary L. Griswold; Walter N. Kirn; Steven E. Skolnick

[57] ABSTRACT

A flexible carrier tape for storage and delivery of electronic components by an advancement mechanism comprises: (a) a strip portion having a top surface, a bottom surface opposite the top surface, and means for engagingly receiving the advancement mechanism; and (b) a plurality of aligned pockets for carrying the electronic components. The pockets are spaced along the strip portion and open through the top surface. The means for engagingly receiving the advancement mechanism comprises a plurality of hollow protuberances that are spaced equally along the strip portion, open through the strip portion, and extend outwardly from the strip portion. The protuberances are adapted to receive the advancement mechanism within the hollow portion. Methods for manufacturing such carrier tapes are also disclosed.

20 Claims, 5 Drawing Sheets

COMPONENT CARRIER TAPE

BACKGROUND OF THE INVENTION

1. Technical Field.

This invention relates generally to carrier tapes of the kind used to transport components from a component manufacturer to a different manufacturer that assembles the components into new products. More specifically, this invention relates to carrier tapes for storing electronic surface mount components and for supplying those components seriatim to a machine. The invention further relates to a method for manufacturing such carrier tapes.

2. Description of the Related Art.

In general, carrier tapes that are used to transport components from a component manufacturer to a different manufacturer that assembles the components into new products are well known. For example, in the field of electronic circuit assembly, electronic components are often transferred from a source of such components to a specific location on a circuit board for attachment thereto. The components may be of several different types, including surface mount components. Particular examples include memory chips, integrated circuit chips, resistors, connectors, dual in-line processors, capacitors, gate arrays, etc. Such components are typically affixed to a circuit board that may later be incorporated into an electronic device.

Rather than manually affixing each individual electronic component to a circuit board, the electronics industry makes extensive use of robotic (i.e., automated) placement machines, sometimes known as "pick-and-place" machines, which grasp a component at a specific location (the source) and place it at another specific location (the circuit board). To ensure the sustained operation of the robotic placement machine, a continuous supply of electronic components must be furnished to the machine at a predetermined rate and location to permit the machine to be programmed to repeat a precise sequence of movements during every cycle. It is therefore important that each such component be located in the same position (i.e. the point at which the robotic placement machine grasps the component) as each preceding and succeeding component.

One way to provide a continuous supply of electronic components to a desired location is to use a carrier tape. Conventional carrier tapes generally comprise an elongated strip that has a series of identical pockets formed at predetermined, uniformly spaced intervals along the length of the tape. Each pocket is shaped to closely receive an electronic component. The tapes also normally include a series of through holes uniformly spaced along one or both edges of the elongated strip. The through holes, frequently referred to as advancement holes, drive holes, sprocket holes or indexing holes, receive the teeth of a drive sprocket that advances the tape toward the robotic placement machine.

Typically, the carrier tapes are manufactured in one location, wound onto a reel, and transported to a second location where the tape is unwound and continuously fed to a machine that automatically loads the pockets with electronic components. The advancement holes accurately position the pockets with respect to the component loading machine to help ensure that each component is deposited into a pocket and in the proper orientation for subsequent removal by the robotic placement machine. A continuous cover tape may then be applied over the elongated strip to retain the components in the pockets.

Usually, the loaded carrier tape is then wound onto another reel for transport to the manufacturing location where the new products are being assembled. The loaded carrier tape is then unwound from the reel and fed to the robotic placement machine that removes the components from the pockets and places them onto the circuit board. The advancement holes accurately position the loaded carrier tape with respect to the robotic placement machine to ensure precision removal of the stored components.

Carrier tapes are often manufactured in a thermoforming operation in which a web of thermoplastic polymer is delivered to a mold that forms the component pockets. The thermoformed web is usually cooled to ambient temperature before being delivered to another manufacturing station where the advancement holes are punched through the web by an automated punching machine. While these operations can be run at an acceptably high line speed, they also require precision handling of the web to ensure that the subsequently punched advancement holes are properly aligned and registered with respect to the component pockets. Failure to provide adequate alignment and registration can result in improper subsequent positioning of the carrier tape in the component loading machine and/or in the robotic placement machine. Since the component pockets are formed separately from the advancement holes, it is necessary to regain registration when the thermoformed web is delivered to the punching machine. This is not always easy to do.

In another manufacturing approach, the thermoplastic polymer web is indexed to a machine that both thermoforms the pockets and punches the advancement holes. Carrier tape segments of about 15 centimeters are often formed in each cycle, and the registration between the component pockets and the advancement holes in any given segment is typically quite good. However, carrier tapes of up to about 1000 meters in length are often provided on a single reel. This requires about 6000 combined thermoforming/punching operations to produce a single reel of carrier tape, and it can be difficult to maintain consistent component pocket-to-advancement hole registration over these distances. In addition, this process is associated with the use of a flat forming die which can limit the speed of the manufacturing line.

Both of the processes described above involve punching a thermoformed web to provide the advancement holes. Punching creates waste (slugs) and dust that may contaminate the components, which can be of special concern when manufacturing precision electronic parts. In addition, the thermoplastic web may be a tough, resilient material that can be difficult to punch. As a result, the punches wear out or break and have to be frequently replaced. Precision punches are expensive and replacing them is a time consuming process that requires delicate realignment and retiming of the new punch.

Consequently, there is a continuing need for component carrier tapes that display excellent advancement hole-to-component pocket registration, especially over the long distances typically found on reel-wound carrier tapes used in the electronics industry. There is also a need for a manufacturing process that provides a means for advancing the carrier tape without punching holes, especially if this can be done without generating slugs or dust.

SUMMARY OF THE INVENTION

The present invention relates broadly to a carrier tape having a plurality of pockets formed therein. In one embodiment, the invention relates to a flexible carrier tape for storage and delivery of electronic components by an advancement mechanism. The carrier tape comprises a strip portion having a top surface, a bottom surface opposite the top surface, and means for engagingly receiving the advancement mechanism. The carrier tape further includes a plurality of aligned pockets for carrying the electronic components, the pockets being spaced along the strip portion and opening through the top surface thereof. The means for engagingly receiving the advancement mechanism comprises a plurality of hollow protuberances that are spaced equally along the strip portion, open through the strip portion, and extend outwardly therefrom, the protuberances being adapted to receive the advancement mechanism within the hollow portion thereof.

The pockets include at least one side wall that adjoins and extends downwardly from the strip portion, and a bottom wall that adjoins the side wall. The pockets more preferably include four side walls each at generally right angles with respect to each adjacent side wall. Typically, each of the pockets is essentially identical and are equally spaced along the strip portion. The bottom wall of each pocket may include an aperture or through hole to, for example, accommodate a mechanical push-up.

The hollow protuberances that provide the means for engagingly receiving the advancement mechanism can open through the top surface of the strip portion and extend downwardly from the bottom surface, or they can open through the bottom surface of the strip portion and extend upwardly from the top surface. Desirably, the hollow protuberances define circular or oval openings through the strip portion. The strip portion further has first and second parallel longitudinal edge surfaces, and preferably at least one of the edge surfaces includes the means for engagingly receiving the advancement mechanism. Even more preferable is to have both the first and second longitudinal edge surfaces include the means for engagingly receiving the advancement mechanism.

The carrier tape can further include a cover that is releasably secured to the top surface of the strip portion, extends along the strip portion, and covers the pockets. Typically, the cover is positioned between the first and second parallel longitudinal edge surfaces of the strip portion.

The carrier tapes of the invention are especially useful for storing and delivering surface mount and through hole electronic components to a machine, such as a robotic placement machine. To facilitate this, the carrier tape can be wound about a core to form a supply reel.

The invention also relates to a method for making such a flexible carrier tape. In one approach the method includes the steps of:

(a) providing a web of a flexible thermoplastic polymer;

(b) delivering the web to a mold or a die;

(c) shaping the web by simultaneously thermoforming the pockets and the hollow protuberances; and (d) cooling the shaped web to harden it.

The web may be provided as a preformed sheet or roll, by direct extrusion, or by continuous injection molding. Preferably the web is shaped in a vacuum thermoforming mold or die.

The carrier tapes of the invention offer significant advantages when the means for engagingly receiving the advancement mechanism is in the form of hollow protuberances. Included among these advantages are: excellent component pocket-to-advancement means registration, simplified manufacturing, reduced waste, diminished dust generation, and elimination of the need to punch the web to form drive holes. However, there are situations in which it may be desirable to provide a carrier tape having conventional drive holes. In this situation, the hollow protuberances can be removed to form through holes in the strip portion, the through holes providing the means for engagingly receiving the advancement mechanism. Advantageously, the hollow protuberances can be removed by techniques other than punching through the strip portion, such as by contact with a sharp blade that shears the hollow protuberances essentially flush with the strip portion.

It is aim possible to thermoform a hollow projection that opens through the bottom wall of the pocket and depends therefrom. This can be done at the same time that the pockets and the hollow protuberances are thermoformed. To form a through hole in the bottom wall, the hollow projection can be subsequently removed by contact with a sharp blade that shears the hollow projection essentially flush with the bottom wall.

BRIEF DESCRIPTION OF THE DRAWINGS

The invention will be more fully appreciated with reference to the following drawings in which similar reference numerals designate like or analogous components throughout and in which.

DETAILED DESCRIPTION OF THE PREFERRED EMBODIMENTS

Figure 1:
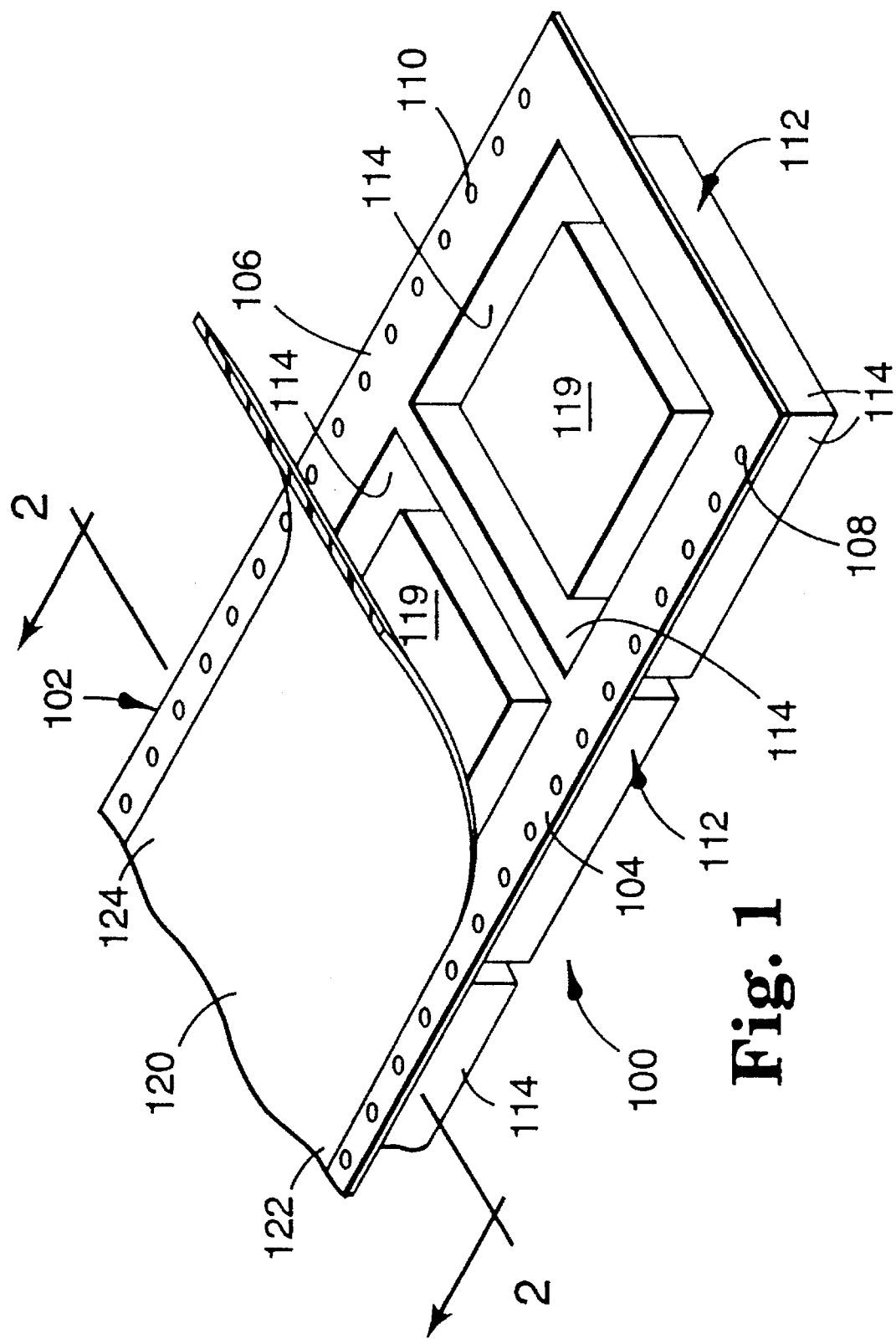
FIG. 1 is a fragmentary perspective view of one embodiment of a carrier tape according to the invention with a cover thereof having been partially removed to show components stored within the carrier tape.
Figure 2:
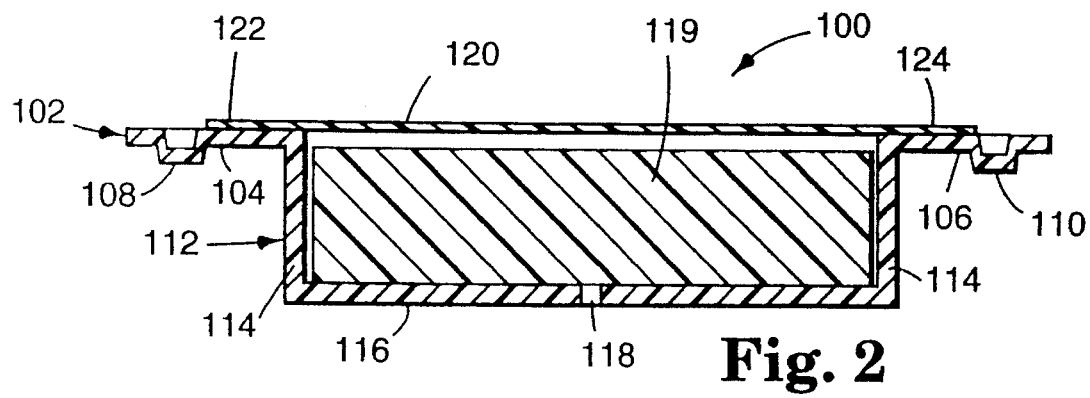
FIG. 2 is a sectional view taken along lines 2—2 in FIG. 1 and showing, in more detail, structures for advancing the carrier tape.
Figure 3:
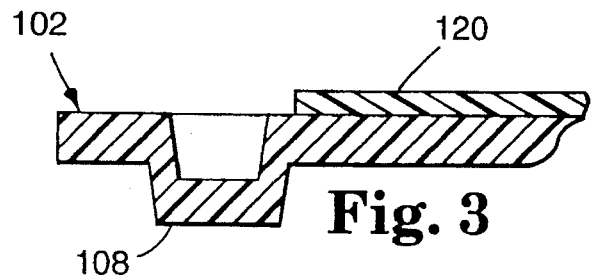
FIG. 3 is an enlarged, fragmentary, sectional view showing in greater detail one embodiment of an advancement structure for use in a carrier tape according to the invention.

Turning now to the drawings, one embodiment of a carrier tape according to the invention is shown in FIGS. 1 through 3. The illustrated carrier tape is useful for the storage and delivery of electronic components by an advancement mechanism. More specifically, a unitary flexible carrier tape 100 has a strip portion 102 defining a top surface and a bottom surface opposite the top surface. Strip portion 102 includes longitudinal edge surfaces 104 and 106, and a row of aligned advancement structures 108 and 110 formed in and extending along one, and preferably both, edge surfaces. Advancement structures 108 and 110 provide a means for engagingly receiving the advancement mechanism and are described more fully hereinbelow.

A series of pockets 112 is formed in and spaced along strip portion 102, as shown in FIGS. 1 and 2, the pockets opening through the top surface of the strip portion. Within a given carrier tape, each pocket is usually essentially identical to the other pockets. Typically, they are aligned with each other and equally spaced apart. In the illustrated embodiment, each pocket includes four side walls 114, each at generally right angles with respect to each adjacent wall. Side walls 114 adjoin and extend downwardly from the top surface of the strip portion and adjoin bottom wall 116 to form pocket 112. Bottom wall 116 is generally planar and parallel to the plane of strip portion 102. Optionally, though desirably, bottom wall 116 may include an aperture or through hole 118 that is of a size to accommodate a mechanical push-up (e.g., a poke-up needle) to facilitate removal of component 119 (such as an electronic component) that is stored in pocket 112. Aperture 118 may also be used by an optical scanner to detect the presence or absence of a component within any given pocket. In addition, aperture 118 may be useful in applying a vacuum to the pocket to permit more efficient loading of the pockets with components. Further discussion of aperture 118 and how it may be formed in accordance with the invention is provided below.

In general, pockets 112 are designed to conform to the size and shape of the components that they are intended to receive. Although not specifically illustrated, the pockets may have more or less side walls than the four that are shown in the preferred embodiment. In general, each pocket includes at least one side wall that adjoins and extends downwardly from strip portion 102, and a bottom wall that adjoins the side wall to form the pocket. Thus, the pockets may be circular, oval, triangular, pentagonal, or have other shapes in outline. Each side wall may also be formed with a slight draft (i.e., a 2° to 12° slant toward or away from the center of the pocket) in order to facilitate insertion of the component, and to assist in releasing the pocket from a mold or forming die during fabrication of the carrier tape. The depth of the pocket can also vary depending on the component that the pocket is intended to receive. In addition, the interior of the pocket may be formed with ledges, ribs, pedestals, bars, rails, appurtenances, and other similar structural features to better accommodate or support particular components. Although a single column of pockets is illustrated in the drawings, two or more columns of aligned pockets could also be formed along the length of the strip portion in order to facilitate the simultaneous delivery of multiple components. It is expected that the columns of pockets would be arranged parallel to each other with pockets in one column being in aligned rows with the pockets in the adjacent column(s).

Strip portion 102 may be formed of any polymeric material that has a sufficient gauge and flexibility to permit it to be wound about the hub of a storage reel. A variety of polymeric materials may be used including, but not limited to, polyester (e.g., glycol-modified polyethylene terephthalate), polycarbonate, polypropylene, polystyrene, polyvinyl chloride, and acrylonitrile-butadiene-styrene. Strip portion 102 may be optically clear, pigmented or modified to be electrically dissipative. In the latter case, the strip may include an electrically conductive material, such as carbon black or vanadium pentoxide, that is either interspersed within the polymeric material or is subsequently coated onto the strip. The electrically conductive material allows an electric charge to dissipate throughout the carrier tape and preferably to the ground. This feature may prevent damage to components contained within the carrier tape due to an accumulated static electric charge.

Carrier tape 100 typically further includes an elongate cover 120, although its inclusion is optional. Cover 120 is applied over the pockets of the carrier tape to retain the components therein. As best shown in FIGS. 1 and 2, cover 120 is flexible, overlies part or, more preferably, all of pockets 112, and is disposed between the rows of advancement structures 108 and 110 along the length of strip portion 102. Cover 120 is releasably secured to the top surface of strip portion 102 so that it can be subsequently removed to access the stored components. As illustrated, cover 120 includes parallel longitudinal bonding portions 122 and 124 that are bonded to longitudinal edge surfaces 104 and 106, respectively, of strip portion 102. For example, a pressure sensitive adhesive such as an acrylate material, or a heat-activated adhesive such as an ethylene vinyl acetate copolymer, may be used to adhere the cover to edge surfaces 104 and 106. Alternatively, cover 120 could be secured to strip portion 102 by a mechanical fastener such as a snap fit interference fastener or a hook and loop fastener (with the hooks being carried by either the cover or the strip portion and the loops being carried by the other).

Referring now to FIGS. 2 through 6, advancement structures 108 and 110 comprise a series of hollow protuberances that extend outwardly from strip portion 102, preferably in a plane perpendicular to the plane of the strip portion. The hollow protuberances have a proximal end that opens through strip portion 102 and a distal end that may be open or closed. The advancement structures are adapted to engagingly receive an advancement mechanism such as sprocket 209 shown in FIG. 10 and sprocket 224 shown in FIG. 11 (discussed more fully below). The advancement mechanism typically comprises one sprocket for each row of advancement structures, and the teeth of each sprocket are engagingly received within the hollow portion of the protuberance where it opens through strip portion 102. The advancement structures in combination with the sprockets advance carrier tape 100 toward a predetermined location. At the predetermined location, the carrier tape may be filled with components (see FIG. 10) or a robotic placement machine may grasp components, seriatim, to, for example, subsequently place them on a circuit board (see FIG. 11).

Figure 4:
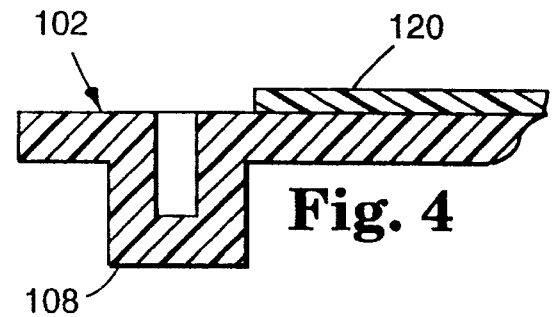
FIG. 4 is a sectional view similar to FIG. 3 and showing another embodiment of the invention.
Figure 5:
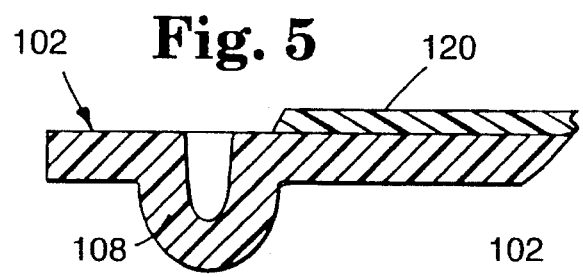
FIG. 5 is a sectional view similar to FIG. 3 and showing a further embodiment of the invention.

Advancement structures 108 and 110 may be formed to have a variety of shapes such as the truncated cone illustrated in both FIG. 2 and in the enlarged, fragmentary, sectional view of FIG. 3, the closed cylinder shown in FIG. 4, or the shallow depression, dimple or dome described in FIG. 5. Other shapes are also possible such as a cone or a cylinder with a domed distal end. The base of the advancement structures where they open through strip portion 102 are typically circular or oval in outline but could have other shapes if desired. In one embodiment, the advancement structures comprise truncated cones having a 10° draft angle (i.e., a slight inward taper from the proximal to the distal end), a depth of about 0.76 mm (0.030 inch), and a circular base with an inside diameter that measures approximately 1.55 mm (0.061 inch), the advancement structures being equally spaced along the strip portion at a distance of approximately 4 mm (0.157 inch) on center.

Figure 6:
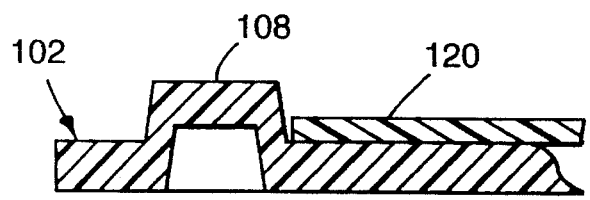
FIG. 6 is a sectional view similar to FIG. 3 and showing a different embodiment of the invention.

The shape of the advancement structure, the shape of the base outline, and the spacing between adjacent structures may be varied to accommodate different types of advancement mechanisms. In the electronics industry, the number, size and spacing of advancement holes is largely standardized to ensure uniformity, and the advancement structures of the invention can be formed to be consistent with the industry standardization which requires alignment between the pockets and the advancement holes. (A common industry standardization is EIA (Electronics Industry Association) 481.) In FIGS. 1 through 5, advancement structures 108 and 110 are illustrated as opening through the top surface of strip portion 102 such that the hollow protuberances project or extend below the bottom surface of the strip portion, as do pockets 112. However, as shown in FIG. 6, the hollow protuberances may also project or extend above strip portion 102 such that they open through the bottom surface of the strip portion, this being the embodiment used in conjunction with the schematic views of FIGS. 10 and 11. It is also possible, though not specifically shown in the drawings, for some of the hollow protuberances to extend in one direction (e.g., downwardly from the bottom surface of the strip portion) while others extend in an opposite direction (e.g., upwardly from the top surface of the strip portion).

In general, the carrier tapes of the present invention are made by shaping both the pockets and the hollow protuberance advancement structures in a sheet of polymeric material and winding the carrier tape onto a reel to form a roll.

Figure 7:
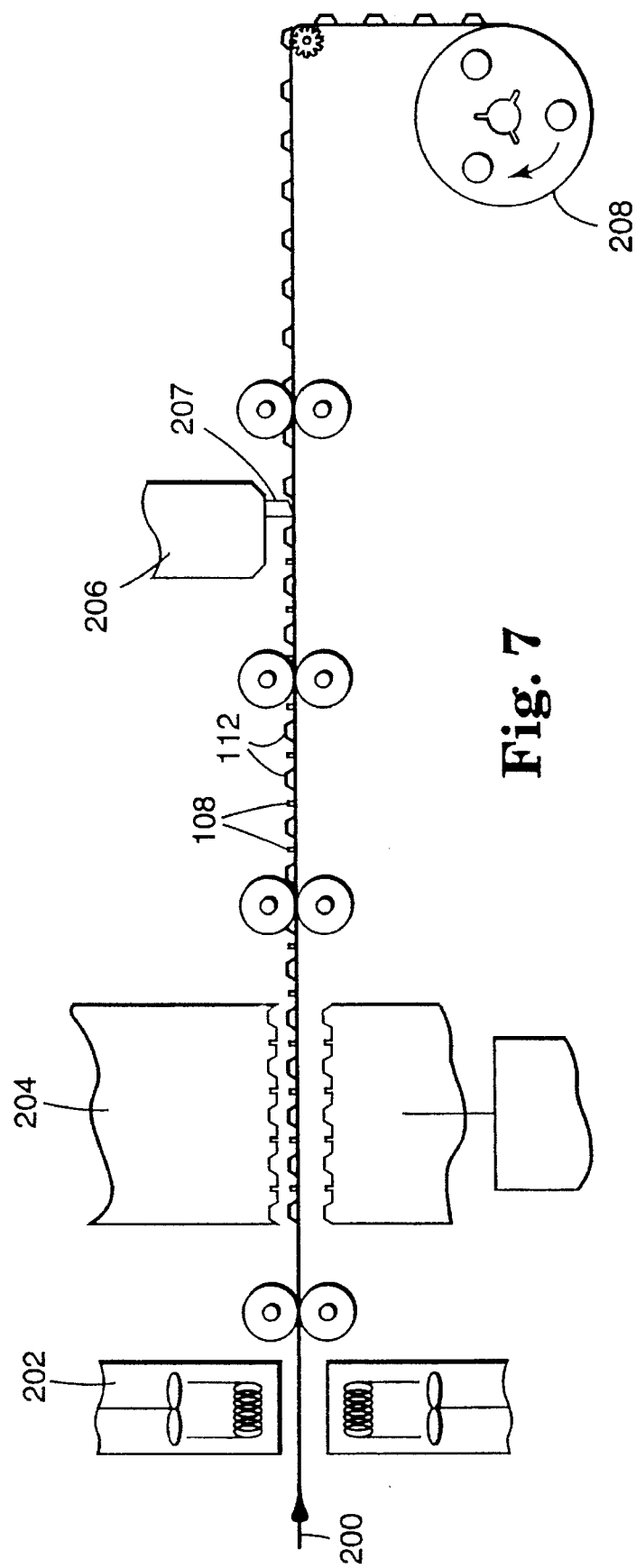
FIG. 7 is a schematic illustration of one method for manufacturing a carrier tape according to the invention.

More specifically, and with reference to the schematic view of FIG. 7 as an example, a web 200 of a flexible thermoplastic polymer is supplied as a preformed roll, as a preformed sheet, by direct extrusion, or by continuous injection molding to a mold or die 204 (which may be a pair of matched male and female dies) that thermoform the web. Mold 204 simultaneously thermoforms the pockets and the advancement structures to the desired size and shape (allowing for any subsequent shrinkage upon cooling). The dimensions of the incoming polymeric web will be determined by the gauge and width of the carrier tape that is to be formed.

By "thermoforms" and "thermoforming" is meant a process that relies on the use of both heat and pressure to deform a thermoplastic material. The heat may be provided by the mold itself, a preheater 202, or an extruder (not shown specifically). In any event, polymeric web 200 is heated sufficiently to permit thermoforming, which occurs at a temperature above the polymer's glass transition temperature. The actual temperature to which the polymeric web must be heated varies over a broad range (i.e., about 200°–370° F.) depending on the gauge and type of material that is being thermoformed as well as the speed of the manufacturing line. The applied pressure is sufficient to permit a high quality replication of the mold or die pattern and may be provided by, for example, the force the mold exerts upon web 200 when the mold closes or by the application of a vacuum that urges the web to deform over a male die or draws the web into a female die (i.e., vacuum thermoforming). Web 200 is typically cooled after thermoforming, which can be accomplished by air cooling, fans, a water bath or a cooling oven until the thermoplastic polymer hardens.

In general, thermoforming is a process that is familiar to those of ordinary skill in the art and is described in various references such as *Encyclopedia of Polmer Science and Engineering*, volume 16, second edition, published by John Wiley & Sons, 1989, which discusses different thermoforming processes and the use of roll-fed, sheet-fed, in-line extrusion, and continuous web-fed systems. All of these can be employed to manufacture the carrier tapes of the invention, as can different thermoforming tools that are described in the technical literature, such as flat forming and rotary devices, these devices being available for use with various thermoforming techniques such as matched mold forming, plug-assist forming, basic vacuum forming, and pressure forming.

Importantly, the pockets and the advancement structures are formed simultaneously which permits excellent registration between these features since their relative orientation is determined by the configuration of the mold in which the carrier tape is thermoformed. To the contrary, in conventional carrier tapes, the advancement, drive or sprocket holes are subsequently formed in a separate punching operation that requires precision handling of the web to ensure that the subsequently punched advancement holes are properly aligned and registered with the component pockets. Failure to provide adequate alignment and registration can result in improper subsequent positioning of the carrier tape in the component loading machine and/or in the robotic placement machine.

In addition, the carrier tapes of the invention offer the advantage of diminished waste and dust. Since the carrier tapes are not punched, the amount of slug waste that must be gathered and disposed of is reduced. This also brings the benefits of decreased maintenance costs and reduced manufacturing down time since the relatively expensive punches do not have to be replaced, realigned and retimed.

Other known manufacturing approaches involve simultaneous thermoforming of the pockets and punching of the advancement holes. However, in these operations it can be difficult to maintain consistent component pocket-to-advancement hole registration over long distances and these processes are associated with the use of a flat forming die which can limit the speed of the manufacturing line. These processes also require the clean up of generated punch slugs and maintaining the punches that produce the advancement holes.

While the carrier tapes of the invention offer particular advantages when the advancement structures are in the form of hollow protuberances, there may be situations in which it is desirable to remove the protuberances. The hollow protuberances may be partially removed to leave a ring or other structure that surrounds the hole in the strip portion which could offer the advantage of a stronger opening through the strip portion. However, it is preferred to provide advancement holes that are essentially flush with the strip portion and similar to those found in conventional carrier tapes. By "essentially flush" it is meant that removal of the hollow protuberances may leave a slight shoulder or other residual structure, but still yields a carrier tape that can be readily handled by conventional, automated equipment intended to be used in conjunction with carrier tape having punched holes, and without the carrier tape getting jammed in the equipment and without the conventional equipment requiring modification.

Figure 8:
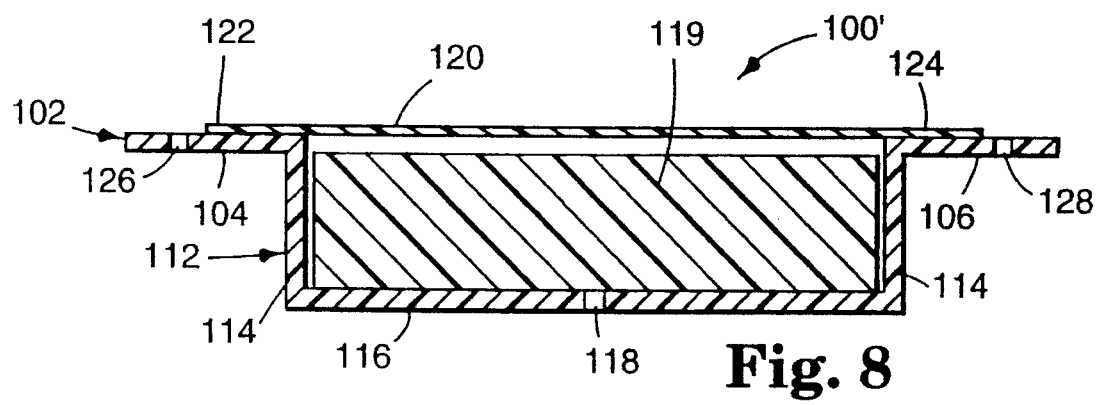
FIG. 8 is a sectional view similar to FIG. 2 and showing an additional embodiment of the invention in which the advancement structures of FIG. 2 have been removed.

Consequently, and with continuing reference to FIG. 7, once thermoformed web 200 exits mold 204 it may be conveyed to protuberance removal station 206 where advancement structures 108 and 110 are removed to yield a carrier tape 100' having advancement, drive or sprocket holes 126 and 128, respectively, as shown in FIG. 8. Thus, advancement holes 126 and 128 provide the means for engagingly receiving the advancement mechanism. The advancement structures may be removed by a variety of techniques such as by a laser, a water jet, a hot wire or by planing, sanding, endmilling, routing or grinding. Although not shown in the drawings, a vacuum line may be used to accumulate generated punch slugs.

However, it has been found especially advantageous to employ one or more sharp edges (e.g., a fixed or vibrating knife or razor blade, which optionally can be heated) that contact the advancement structures to sever or shear them essentially flush with strip portion 102 such as sharp edge 207 shown in FIG. 7. The blade can be fashioned from a variety of materials including tool steel, high carbide steel and ceramics. Particularly useful is an ordinary stainless steel, beveled, utility knife blade that has been cut to the appropriate size (if necessary), oriented at a 45° angle with respect to the longitudinal axis of the approaching polymeric (polycarbonate) web, and positioned with about a 10° pitch such that the advancing carrier tape rides against the knife blade which engages and shears each advancement structure in sequence. (The blade pitch and orientation may change as the material of polymer web changes or the blade material changes.) For carrier tapes having advancement structures formed along each longitudinal edge, as shown in FIG. 1, a separate protuberance removal station may be employed to remove the advancement structures from each longitudinal edge of the carrier tape, or a single removal station configured, for example, to have a separate knife blade for removing the advancement structures from each edge may be used.

Each of the techniques described above offers the advantage of removing advancement structures 108 and 110 essentially flush with strip portion 102. Thus, the size and location of advancement holes 126 and 128 that are formed upon removal of, respectively, advancement structures 108 and 110, is essentially the same as the size and location of the openings through strip portion 102 originally created by the advancement structures. Similarly, the spacing between adjacent advancement holes along each longitudinal edge is the same as the spacing that existed between adjacent advancement structures prior to their removal.

Consequently, punching is not considered a preferred removal technique as the repetitive punching of the carrier tape creates a new set of holes. Precision placement of the advancement holes by subsequently punching through the advancement structures would require regaining registration between the component pockets and the advancement structures, which could erase the original benefits achieved by simultaneously forming them. Thus, the methods described herein offer the advantage of removing the hollow protuberances other than by punching through the strip portion.

In addition, in the case of a carrier tape in which some of the hollow protuberances extend outwardly from the strip portion in one direction, while other of the hollow protuberances extend outwardly from the strip portion in an opposite direction, only those hollow protuberances that extend in one direction can be selectively removed such that the remaining, unremoved hollow protuberances can provide a function in addition to a means for advancing the carrier tape, such as counting pockets, identification, and so on.

Figure 9:
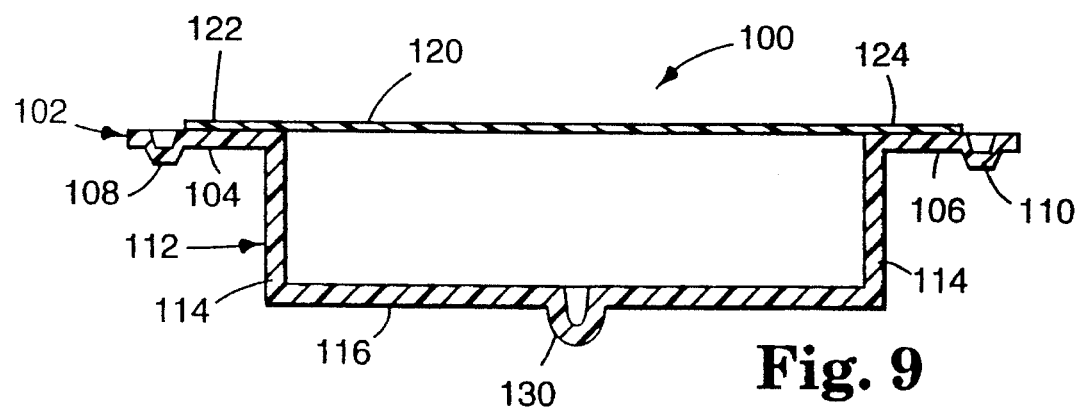
FIG. 9 is a sectional view similar to FIG. 2 (but without a stored component) and showing a carrier tape according to the invention prior to the removal of a hollow projection, which removal forms an aperture in a bottom wall of a component pocket that is formed in the carrier tape.

Turning now to FIG. 9, it is also possible to thermoform a hollow projection 130 in bottom wall 116 of pocket 112 at the same time that the pocket and advancement structures 108 and 110 are thermoformed. Hollow projection 130 has a proximal end that opens through bottom wall 116 and a distal end that may be open or closed, the hollow projection depending from the bottom wall. Hollow projection 130 may have a variety of shapes, forms and sizes, including all of the ones discussed above as available for providing advancement structures 108 and 110. In one embodiment, hollow projection 130 comprises a truncated cone having a 10° draft angle, a depth of about 0.51 mm (0.020 inch), and a circular base with an inside diameter that measures approximately 1 mm (0.039 inch). Hollow projection 130 is removed at protuberance removal station 206 or at another similarly functioning station so as to form aperture 118 shown in FIG. 1. Hollow projection 130 may be removed by the same techniques as described above for removing advancement structures 108 and 110 and the use of a sharp edge (e.g., a fixed or vibrating knife or razor blade, which optionally can be heated) that contacts hollow projection 130 to sever or shear it essentially flush with bottom wall 116 is preferred. Particularly useful is an ordinary stainless steel utility knife blade that has been cut to the appropriate size (if necessary), oriented at a 45° angle with respect to the longitudinal axis of the approaching polymeric web, and positioned with about a 10° pitch such that the advancing carrier tape rides against the knife blade which engages and shears each hollow projection in sequence Thus, apertures 118 may be formed without punching the carrier tape which enables their size and shape to be conveniently customized. Apertures 118 may also be precisely positioned in the bottom wall of the pocket because they are simultaneously thermoformed with the pockets and the hollow protuberance advancement structures, rather than being subsequently punched.

Figure 10:
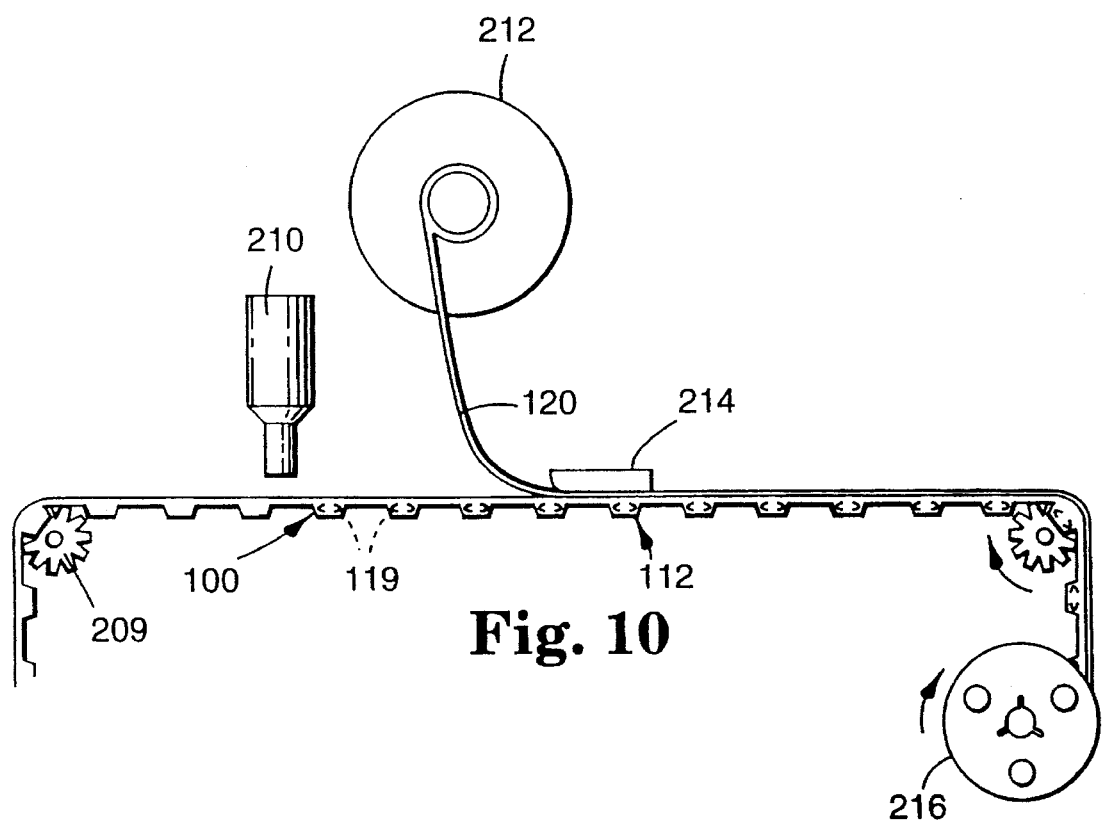
FIG. 10 is a schematic view illustrating how a carrier tape according to the invention may be loaded with components followed by the application of a cover.

Referring again to FIG. 7, the carrier tape (whether the hollow protuberance advancement structures have been removed or not) is wound (either concentric or level windings) about the core of reel 208 to form a supply roll for storage until the carrier tape is loaded with components. Alternatively, and as shown in FIG. 10, immediately after carrier tape 100, the hollow protuberances having been omitted for clarity (or carrier tape 100', not illustrated) is formed, a component loader 210 may fill pockets 112 with components 119, cover 120 (if included) is delivered from a roll 212 and secured by an applicator 214 (which is heated in the case of a cover that provides a heat-activated bond) to the longitudinal edge surfaces of the carrier tape strip portion, and the loaded carrier tape is wound about a core or reel 216 for storage or delivery. Carrier tape 100 is advanced by a sprocket 209, which is engagingly received by advancement structures (or advancement holes if the advancement structures have been removed) formed in carrier tape 100, to advance the carrier tape toward component loader 210. If the carrier tape includes the hollow protuberance advancement structures, it may be necessary to modify the carrier tape handling equipment to provide some additional clearance to accomodate the hollow protuberances.

Figure 11:
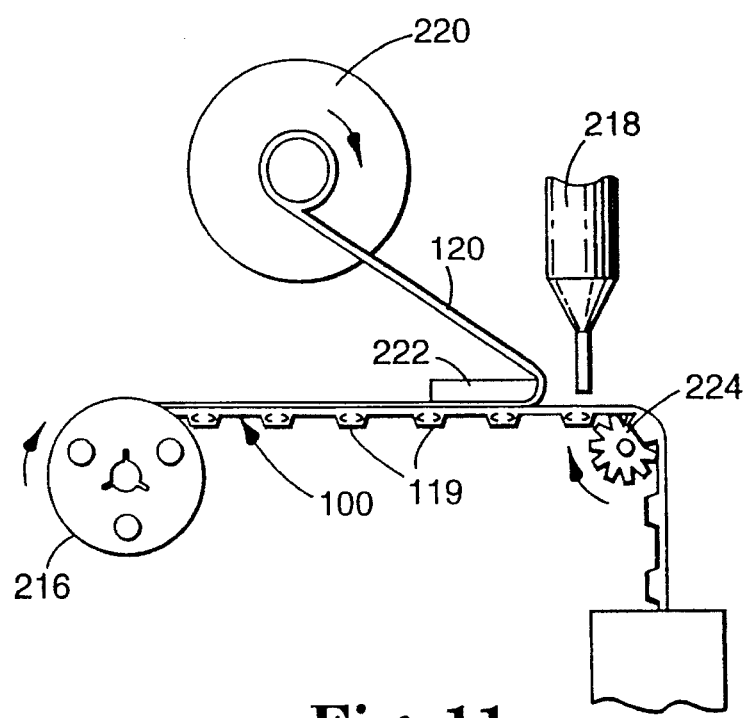
FIG. 11 is a schematic view illustrating a robotic machine removing components from a carrier tape according to the invention.

In use, the carrier tape is unloaded as shown in the schematic example of FIG. 11, which illustrates a carrier tape 100, the hollow protuberances having been omitted for clarity, (or carrier tape 100' not illustrated) in combination with a robotic placement machine 218. Supply reel 216 provides carrier tape 100. A stripper assembly 220 peels cover 120 from carrier tape 100 around a stripper block 222, which assists in preventing the stripper assembly from pulling the carrier tape away from its designated path. Carrier tape 100 is advanced by a sprocket 224, which is received by advancement structures (or advancement holes if the advancement structures have been removed) formed in carrier tape 100, to move the carrier tape toward robotic placement machine 218. As each successive component reaches the desired pick-up point, the robotic placement machine grasps the component (either manually or by suction) and places it, for example, on a circuit board in the appropriate location. If the carrier tape includes the hollow protuberance advancement structures, it may be necessary to modify the carrier tape handling equipment to provide some additional clearance to accomodate the hollow protuberances.

The carrier tapes of the invention are particularly useful in the electronics industry for transporting and delivering surface mount and through hole electronic components such as memory chips, integrated circuit chips, resistors, connectors, dual in-line processors, capacitors, gate arrays, capacitors, etc. However, the carrier tapes of the invention may also be used to transport other small components that are typically delivered to precision placement machines such as watch springs, small screws, surface mount electric component shields, and the like.

The present invention has now been described with reference to several embodiments thereof. It will be apparent to those skilled in the art that many changes can be made in the embodiments described without departing from the scope of the invention. Hence, the scope of the present invention shall not be limited by the structures described herein, but only by structures described by the language of the claims and the equivalents of those structures.

The embodiments for which an exclusive property or privilege is claimed are defined as follows:

1. A flexible carrier tape for storage and delivery of electronic components by an advancement mechanism, the carrier tape comprising:

(a) a strip portion having a top surface, a bottom surface opposite the top surface, and means for engagingly receiving the advancement mechanism; and (b) a plurality of aligned pockets for carrying the electronic components, the pockets being spaced along the strip portion and opening through the top surface thereof;

wherein the means for engagingly receiving the advancement mechanism comprises a plurality of hollow protuberances that are spaced equally along the strip portion, open through the strip portion, and extend outwardly from the strip portion, the protuberances being adapted to receive the advancement mechanism within the hollow portion thereof.

2. A flexible carrier tape according to claim 1 wherein each pocket comprises:

(i) at least one side wall adjoining and extending downwardly from the strip portion; and (ii) a bottom wall adjoining the at least one side wall to form the pocket.

3. A flexible carrier tape according to claim 2 wherein each pocket comprises:

(i) four side walls each at generally right angles with respect to each adjacent side wall, the side walls adjoining and extending downwardly from the strip portion; and (ii) a bottom wall adjoining the side walls to form the pocket.

4. A flexible carrier tape according to claim 3 wherein the bottom wall of each pocket includes an aperture formed through the bottom wall.

5. A flexible carrier tape according to claim 1 wherein each of the pockets is essentially identical and are equally spaced along the strip portion.

6. A flexible carrier tape according to claim 1 wherein the plurality of pockets includes more than one aligned column of pockets extending along the length of the strip portion.

7. A flexible carrier tape according to claim 1 wherein the plurality of hollow protuberances open through the top surface of the strip portion and extend downwardly from the bottom surface of the strip portion.

8. A flexible carrier tape according to claim 1 wherein the plurality of hollow protuberances open through the bottom surface of the strip portion and extend upwardly from the top surface of the strip portion.

9. A flexible carrier tape according to claim 1 wherein the strip portion has first and second parallel longitudinal edge surfaces and at least one of the edge surfaces includes the means for engagingly receiving the advancement mechanism.

10. A flexible carrier tape according to claim 9 wherein both the first and second longitudinal edge surfaces include the means for engagingly receiving the advancement mechanism.

11. A flexible carrier tape according to claim 1 wherein the hollow protuberances are tapered.

12. A flexible carrier tape according to claim 1 wherein the hollow protuberances define either circular or oval openings through the strip portion.

13. A flexible carrier tape according to claim 1 wherein each pocket comprises:

(i) at least one side wall adjoining and extending downwardly from the strip portion; and (ii) a bottom wall adjoining the at least one side wall to form the pocket, the bottom wall having a hollow projection that opens through the bottom wall and depends therefrom.

14. A flexible carrier tape according to claim 1 wherein at least one of the pockets contains a surface mount or through hole electronic component.

15. A flexible carrier tape according to claim 1 further including a cover releasably secured to the top surface of the strip portion, extending along the strip portion, and covering the plurality of pockets.

16. A flexible carrier tape according to claim 1 wherein the strip portion has first and second parallel longitudinal edge surfaces and at least one of the edge surfaces includes the means for engagingly receiving the advancement mechanism, the carrier tape further including a cover releasably secured to the top surface of the strip portion between the longitudinal edge surfaces, extending along the strip portion, and covering the plurality of pockets.

17. A flexible carrier tape according to claim 1 wound about the core of a reel.

18. A flexible carrier tape for storage and delivery of electronic components by an advancement mechanism, the carrier tape comprising:

(a) a strip portion having a top surface, a bottom surface opposite the top surface, and first and second parallel longitudinal edge surfaces, at least one of the edge surfaces having means for engagingly receiving the advancement mechanism; and (b) a plurality of aligned pockets for carrying the electronic components, the pockets being equally spaced along the strip portion and opening through the top surface thereof, each pocket comprising (i) four side walls each at generally right angles with respect to each adjacent side wall, the side walls adjoining and extending downwardly from the strip portion; and (ii) a bottom wall adjoining the side walls to form the pocket;

wherein the means for engagingly receiving the advancement mechanism comprises a plurality of hollow protuberances that are spaced equally along the strip portion and either (1) open through the top surface of the strip portion and extend downwardly from the bottom surface of the strip portion or (2) open through the bottom surface of the strip portion and extend upwardly from the top surface of the strip portion, the protuberances defining circular or oval openings through the strip portion and being adapted to receive the advancement mechanism within the hollow portion thereof.

19. A flexible carrier tape according to claim 18 further comprising a cover releasably secured to the top surface of the strip portion between the longitudinal edge surfaces, extending along the strip portion, and covering the plurality of pockets.

20. A flexible carrier tape according to claim 19 wherein at least one of the pockets contains a surface mount or through hole electronic component.

* * * * *